(12) United States Patent
Vandermeulen

(10) Patent No.: US 9,130,503 B2
(45) Date of Patent: Sep. 8, 2015

(54) SOLAR ENERGY SYSTEMS

(75) Inventor: Peter F. Vandermeulen, Newburyport, MA (US)

(73) Assignee: 7AC Technologies, Inc., Beverly, MA (US)

( * ) Notice: Subject to any disclaimer, the term of this patent is extended or adjusted under 35 U.S.C. 154(b) by 586 days.

(21) Appl. No.: 12/775,982

(22) Filed: May 7, 2010

(65) Prior Publication Data
US 2011/0005580 A1     Jan. 13, 2011

Related U.S. Application Data

(60) Provisional application No. 61/176,645, filed on May 8, 2009.

(51) Int. Cl.
*H01L 31/042*     (2014.01)
*H02S 40/44*     (2014.01)
*F24J 2/20*     (2006.01)
(Continued)

(52) U.S. Cl.
CPC .............. *H02S 40/44* (2014.12); *F24J 2/0023* (2013.01); *F24J 2/204* (2013.01); *F24J 2/205* (2013.01); *H02S 40/22* (2014.12); *H02S 40/32* (2014.12); *H02S 40/38* (2014.12); *H02S 50/00* (2013.01); *F24J 2002/0092* (2013.01); *H01L 31/044* (2014.12); *Y02E 10/44* (2013.01); *Y02E 10/50* (2013.01); *Y02E 10/60* (2013.01)

(58) Field of Classification Search
CPC ..... Y02E 10/60; H01L 31/0521; H02S 40/44; F24J 2/0023
USPC ............................ 136/251, 246, 248; 126/609
See application file for complete search history.

(56) References Cited

U.S. PATENT DOCUMENTS 4,010,734 A * 3/1977 Chayet .......................... 126/587
4,106,482 A * 8/1978 Savage et al. ................. 126/587
(Continued)

FOREIGN PATENT DOCUMENTS

EP     1094283 A1    4/2001

OTHER PUBLICATIONS

International Search Report and Written Opinion for PCT/US2010/034055 dated Dec. 17, 2010.

*Primary Examiner* — Allison Bourke
(74) *Attorney, Agent, or Firm* — Rajesh Vallabh; Foley Hoag LLP

(57) ABSTRACT

A solar energy module includes a photovoltaic unit including a layer of one or more solar cells. The layer has a front side exposed to incident radiation and an opposite back side. The solar energy module also includes a thermal unit thermally coupled to the back side of the layer of one or more solar cells. The thermal unit includes one or more channels through which a thermal transfer fluid flows, wherein a portion of the incident radiation is converted into electricity by the layer of one or more solar cells and a portion of the incident radiation is simultaneously converted to heat for increasing the temperature of the thermal transfer fluid. The solar energy module also includes a heating system to further increase the temperature of the thermal transfer fluid. The heating system is powered by electricity generated by the one or more solar cells. The solar energy module further includes a controller for controlling the relative amounts of heat and electricity output by the solar energy module by controlling the amount of electricity produced by the one or more solar cells that is diverted to the heating system for increasing the temperature of the thermal transfer fluid.

11 Claims, 12 Drawing Sheets

(51) Int. Cl.
  *G01R 31/40* (2014.01)
  *H02S 40/22* (2014.01)
  *H02S 40/38* (2014.01)
  *H02S 40/32* (2014.01)
  *F24J 2/00* (2014.01)
  *H01L 31/044* (2014.01)

(56) References Cited

U.S. PATENT DOCUMENTS

| | | | |
|---|---|---|---|
| 4,106,952 A * | 8/1978 | Kravitz | 136/206 |
| 4,483,320 A * | 11/1984 | Wetzel et al. | 126/584 |
| 5,293,447 A * | 3/1994 | Fanney et al. | 392/449 |
| 5,522,944 A * | 6/1996 | Elazari | 136/248 |
| 6,080,927 A * | 6/2000 | Johnson | 136/248 |
| 6,171,374 B1 | 1/2001 | Barton et al. | |
| 6,487,872 B1 | 12/2002 | Forkosh et al. | |
| 6,546,746 B2 | 4/2003 | Forkosh et al. | |
| 6,976,365 B2 | 12/2005 | Forkosh et al. | |
| 7,279,215 B2 | 10/2007 | Hester et al. | |
| 8,337,590 B2 | 12/2012 | Herencia et al. | |
| 8,695,363 B2 | 4/2014 | Tang et al. | |
| 8,696,805 B2 | 4/2014 | Chang et al. | |
| 8,769,971 B2 | 7/2014 | Kozubal et al. | |
| 8,790,454 B2 | 7/2014 | Lee et al. | |
| 2002/0121298 A1 | 9/2002 | Konold | |
| 2005/0161074 A1 | 7/2005 | Garvison et al. | |
| 2013/0056177 A1 | 3/2013 | Coutu et al. | |
| 2013/0186121 A1 | 7/2013 | Erb et al. | |
| 2013/0199220 A1 | 8/2013 | Ma et al. | |
| 2013/0227982 A1 | 9/2013 | Forkosh | |
| 2013/0255287 A1 | 10/2013 | Forkosh | |
| 2014/0054004 A1 | 2/2014 | LePoudre et al. | |
| 2014/0054013 A1 | 2/2014 | LePoudre et al. | |
| 2014/0223947 A1 | 8/2014 | Ranjan et al. | |
| 2014/0260367 A1 | 9/2014 | Coutu et al. | |
| 2014/0260369 A1 | 9/2014 | LePoudre | |
| 2014/0260398 A1 | 9/2014 | Kozubal et al. | |
| 2014/0262125 A1 | 9/2014 | Erb et al. | |
| 2014/0262144 A1 | 9/2014 | Erb et al. | |
| 2014/0264968 A1 | 9/2014 | Erb et al. | |
| 2014/0360373 A1 | 12/2014 | Peacos et al. | |

* cited by examiner

SOLAR ENERGY SYSTEMS

CROSS REFERENCE TO RELATED APPLICATION

This application claims priority from U.S. Provisional Patent Application Ser. No. 61/176,645, filed on May 8, 2009, entitled Solar Energy Systems, which is hereby incorporated by reference.

BACKGROUND

The present application relates generally to solar energy systems for the conversion of solar radiation to useful forms of energy, such as electrical and thermal energy as commonly generated by photovoltaic panels and solar-thermal panels.

Current photovoltaic panels ("solar panels" or "modules" are other terms commonly used), derive electrical current by the conversion of photon energy from the sun to electron energy by means of the photo-electric effect. However, current photovoltaic panel technology has limitations in the amount of energy that can be converted in the active layers of the panel. Different technologies are known that convert photon energy with higher or lower efficiency. Typically thin "wafer"-slices are of a material are cut from a block or crystal. Wafer shaped materials such as Gallium Arsenide (GaAs) have demonstrated conversion efficiencies as high as 40%. Other wafers commonly used are monocrystalline silicon (c-Si) and polycrystalline silicon (p-Si), with demonstrated conversion efficiencies of up to 20%. However, in practice, an efficiency between 12% and 18% is fairly common. Newer thin-film photovoltaic layers, which do not use wafer-like substrates, such as amorphous silicon (a-Si), micro-crystalline silicon (u-Si), and thin layers such as Cadmium Telluride (CdTe) and Copper Indium Gallium Selenide (CIGS) as well as polymer organic based active layers, are being pursued. Each of these technologies exhibits some level of energy conversion efficiency for some level of manufacturing cost. Oftentimes the economical considerations evolve around a cost per Watt of energy produced. The thin-film technologies above, typically demonstrate lower conversion efficiencies but do so at a lower manufacturing cost, which makes them viable for economically competitive photovoltaic applications. In other applications, the square footage of the photovoltaic installation is important because of space limitations. In those application c-Si or p-Si are preferred because even though they have a higher manufacturing cost, they use up less valuable space. Other concerns, such as the reliability of the film quality over the anticipated life of the product (which is oftentimes desired to be in the range of 30 years) as well as the concerns of dealing with some of the waste products of the manufacturing process (Arsenic, Cadmium, etc.) need to be taken into account when designing modules for photovoltaic applications. Furthermore, the environment in which the photovoltaic modules are used has a significant impact on the performance of the product. This involves elements such as orientation of the panel towards the sun, shading on the panel from nearby obstructions such as trees and other obstacles that can block a portion of a panel or entire panels and the weather, temperature, and wind in the location where the panel is expected to operate. For example, panels covered with snow can exhibit significantly reduced electrical production.

Additional considerations for cost effectiveness of photovoltaic products involve the cost of the system installation and the cost of the needed peripheral devices such as batteries or energy storage devices, DC to AC inverters, tracking systems (which have the ability to keep the panel oriented in the proper direction), and integrated system controllers.

Current photovoltaic panels capture only a small portion of the incident energy. Around 80% of the incident energy is not captured and either reflected back into the atmosphere or is re-emitted as radiation, which is typically in the infrared range. The manufacturing cost of the current solutions is relatively high for both wafer based panels and thin film based panels and the light conversion efficiency deteriorates over time due to the exposure of materials to the incident radiation and because of thermal effects in the active photovoltaic layers.

On the other hand, solar energy can also be captured by systems commonly known as solar hot water panels. In such panels, the solar radiation is captured on a surface that is thermally connected to a liquid reservoir or channel. The solar radiation is transferred as heat to the liquid, which is often water or a water-glycol mixture or some other thermal transfer fluid. The heated liquid is then transferred to a tank where it is stored and accumulated until it is needed. Oftentimes heat exchangers are used to withdraw the heat from the storage tank. Commonly such systems are implemented as either pressurized systems that are close-looped and where the liquid is always present in the solar hot water panels, or as drain-back systems, where the liquid is circulated and heated when there is adequate solar energy to increase the temperature of the heat transfer fluid and subsequently the liquid is removed when there is inadequate solar energy.

Solar electrical panels and solar hot water panels are commonly employed on buildings to capture as much incident radiation as possible and to convert such incident radiation to useful forms of energy, whether that is electrical or heat. Electrical panels are commonly connected in series or in parallel to other panels and ultimately connected to an electrical management and conversion system such as an inverter or power distribution panel. The goal of the balance of the system is to maximize the efficient production of electrical energy so that the building's reliance on the electrical grid can be reduced or even eliminated. Inverters are used to connect several chains of panels together and to control the production of AC electrical power. Such inverters oftentimes also control battery banks, manage critical loads, and can start emergency standby power generators.

Similarly, solar hot water panels are connected in series or in parallel, so that a maximum amount of hot liquid is produced at times when such production is most efficient. Again, a central controller is oftentimes employed to manage other system components such as pumps, thermocouples, and valves.

BRIEF SUMMARY

Disclosed herein are methods and systems used for photovoltaic and solar thermal applications and the manufacturing and implementation of photovoltaic panels and integration into building energy management systems.

In accordance with one or more embodiments, methods and systems are provided for the conversion of photon energy from the sun through simultaneous absorption in a photovoltaic layer where a portion of the incident radiation is converted to electricity and another portion of the incident energy is converted to heat for increasing the temperature of a thermal transfer fluid.

In accordance with one or more embodiments, methods and systems are provided where a thermal transfer fluid is used to deliver heat to a photovoltaic panel such that snow, ice, condensation, rime, frost and the like that may be present on the surface of the panel can be removed from the surface of the panel so that the panel may convert a higher percentage of incident photon energy to electricity.

In accordance with one or more embodiments, methods and systems are provided for the pre-heating and/or post-heating of a thermal transfer fluid so that the thermal transfer fluid may assume a different temperature as it enters or leaves a photovoltaic panel or module.

In accordance with one or more embodiments, methods and systems are provided to control the heat transfer between various layers of a photovoltaic panel and a heat transfer fluid such that the heat transfer results in an optimal operating temperature of the active photovoltaic layers as well as a proper heating of the heat transfer fluid.

In accordance with one or more embodiments, methods and systems are provided to encapsulate the photovoltaic layer of a solar panel or module into an enclosed package so that the photovoltaic layer is thermally connected to a heat transfer fluid but the heat transfer from the photovoltaic layer to other parts of the module such as the front glass cover or the side walls is significantly restricted or inhibited.

In accordance with one or more embodiments, methods and systems are provided to encapsulate a photovoltaic layer on top of a heat transfer liquid container embedded in a backing of the module so that it provides channels for the passage of such a heat transfer fluid.

In accordance with one or more embodiments, methods and systems are provided for connecting pre- or post-heating elements to a local electronic control module.

In accordance with one or more embodiments, methods and systems are provided for connecting a photovoltaic layer to a local electronic control module. In some embodiments, such a local control module contains a microprocessor or embedded microcontroller and software to run the microprocessor or microcontroller.

In accordance with one or more embodiments, methods and systems are provided to interconnect pre- or post-heating elements through a local electronic control module to the electrical energy produced by a photovoltaic layer.

In accordance with one or more embodiments, methods and systems are provided wherein the local control module receives signals from a central controller over a wired or a wireless communications network. In some embodiments, the local control module can communicate its unique identification parameters to the central controller. In some embodiments, the local control module can receive a new version of its control software over a wired or wireless communications network.

In accordance with one or more embodiments, methods and systems are provided wherein the central control module can communicate with a local controller and have the local control module change the delivery of electrical energy to either be used for local pre- and/or post-heating of a transfer fluid or to deliver such electrical energy to a central location for use by other electrical components.

In accordance with one or more embodiments, methods and systems are provided wherein thermocouple elements are integrated into a photovoltaic electric module that has an integral heat transfer liquid bed so that the thermocouples can measure the temperature of the surrounding heat transfer fluid and/or photovoltaic layers.

In accordance with one or more embodiments, methods and systems are provided wherein the output of thermocouple elements is used to calculate the thermal energy produced by a heat transfer fluid mounted against a photovoltaic panel.

In accordance with one or more embodiments, methods and systems are provided wherein a photovoltaic panel includes a photovoltaic layer thermally connected to a heat transfer liquid and where the heat transfer liquid can be heated by either the incident long wave radiation of the sun or by a pre- or post liquid entry heating element.

In accordance with one or more embodiments, methods and systems are provided wherein the pre- or post heating elements are integrated to the front glass of a photovoltaic module. In some embodiments, such heating elements are thick film heating elements as are commonly used for automobile windows.

In accordance with one or more embodiments, methods and systems are provided wherein the pre- or post heating elements and one or more thermocouples are integrated to the front glass of a photovoltaic module.

In accordance with one or more embodiments, methods and systems are provided wherein a local controller module can be directed to divert electrical energy from a photovoltaic layer to a local heating system. In some embodiments, the heating system includes heating wires brought in contact with a heat transfer fluid. In some embodiments, the heating system includes wires connected to the front glass of a photovoltaic module.

In accordance with one or more embodiments, methods and systems are provided wherein heat transfer fluid channels are provided in various patterns so that individual photovoltaic/liquid panels can be easily combined in series or parallel to each other.

In accordance with one or more embodiments, methods and systems are provided wherein the front glass of the photovoltaic module has a corrugated surface pattern. In some embodiments, the corrugated or wavy surface allows for the capture of solar incident radiation more effectively over a larger range of solar azimuth angles. In some embodiments, the photovoltaic layer that is combined with the wavy glass surface is a thin-film photovoltaic layer.

In accordance with one or more embodiments, methods and systems are provided wherein a wavy glass surface with a photovoltaic layer are thermally conductively mounted to a heat transfer liquid. In some embodiments, the wavy glass surface and photovoltaic layer are bonded into a housing containing channels for the heat transfer liquid. In some embodiments, the housing contains heating elements and/or thermocouple elements. In some embodiments, the photovoltaic layer is also electrically connected to a local controller which in turn is connected to the heating elements and thermocouples.

In accordance with one or more embodiments, methods and systems are provided wherein a local controller is able to detect the performance of a photovoltaic layer by sending an electrical signal such as an electronic pulse or electronic wave signal through such a photovoltaic layer and analyzing the results. In some embodiments, the local controller can communicate the results to a central controller for further analysis and action. In some embodiments, the central controller can direct the local controller to change its operating conditions.

In accordance with one or more embodiments, methods and systems are provided wherein several photovoltaic modules that are each thermally connected to a heat transfer liquid are combined into a larger system and whereby each module provides a small portion of the overall electrical and thermal energy. In some embodiments, such a system is monitored by a central controller. In some embodiments, such a system integrates other components such as inverters, energy storage modules such as battery banks, flywheels, capacitor banks and the like for electrical storage and hot liquid tanks or thermal heat sinks for thermal energy storage.

In accordance with one or more embodiments, methods and systems are provided wherein the central controller receives information from multiple outside sources as well as the local controllers. In some embodiments, such outside sources are sensors, the internet, or a user's input. In some embodiments, the internet provides a subscription based regular update commonly know as an RSS feed (Really Simple Syndicate, a common communication method used on the Internet) or XML (eXtensible Markup Language) or other convenient communication messaging system. In some embodiments, the RSS feed contains pertinent information for decision processes such as for example—but not limited to—weather forecasts, current energy prices and energy price forecasts etc.

In accordance with one or more embodiments, methods and systems are provided wherein the central controller controls photovoltaic panels and other active elements such as inverters, pumps, valves, heating elements, air-conditioning units, heat pumps, and the like.

In accordance with one or more embodiments, methods and systems are provided wherein a stored program in the central controller contains an algorithm. In some embodiments, such an algorithm creates a decision process wherein the input parameters such as the information received from the one or more local controllers and the information received from a user or the internet are compiled into a forecast of the short term cost of operating the building. In some embodiments, the stored algorithm contains a database. In some embodiments, the database contains historical performance information of the various elements of the system. In some embodiments, the current information and the historical information are used to combine into a forecast for operating cost of the building. In some embodiments, the forecast of the cost of the building is minimized by adjusting the operating parameters of the system. In other embodiments the algorithm has various operating scenarios to deal with various situations such as situations in which ice is present on the photovoltaic panels, situations in which there is no support from other energy sources such as the electrical grid, or situations in which there is no need to create a comfortable living environment in the building, but the optimization routine is simply used to generate as much income as possible by selling electrical or other energy back to an electrical grid.

In accordance with one or more embodiments, methods and systems are provided wherein the photovoltaic and heat energy are generated in multiple more-or-less equal zones. Buildings oftentimes have limited space to accommodate photovoltaic or solar hot water modules. In some embodiments, this may result in the installation of panels in separate sections, wherein the panels in each section are more or less equally oriented towards the sun, but where the various sections have a different orientation to the sun. In some embodiments, such systems operate in accordance with a zone based control algorithm. In some embodiments, the central controller can set the photovoltaic hot water panels to a different performance setting for each zone.

In accordance with one or more embodiments, methods and systems are provided wherein a photovoltaic panel is thermally combined with a liquid heat transfer system and a local control module. The local control module receives electrical energy from the photovoltaic layer or from a local storage unit such as a small battery or capacitor. The local control module also receives thermal information from one or more thermocouples and the local control module is able to switch more or less electrical power into one or more heating elements that are thermally connected to either the heat transfer fluid or the front glass cover of the photovoltaic module.

The advantage of such an arrangement is in cold climates that locally produced photovoltaic electrical energy can be used to melt a snow or ice cover that is (partially) blocking the panel thereby significantly increasing its electrical energy production. Conversely the panel can also be heated by introducing hot thermal fluid that has previously been stored in a thermal storage basin or sink or that is obtained through other heating means. Furthermore, the advantage of such a system is that if the building's energy forecast is showing a larger demand for—for example—hot water than is currently available, the local controller can be commanded to divert some or all electrical energy towards liquid heating. In addition, the advantage of such a system is that in hot climates the photovoltaic layer can be kept at a much lower temperature than would otherwise be the case. High temperatures can reduce the electrical production of photovoltaic panels and shorten the service lifetime of the photoactive materials. By using a heat transfer liquid, the panel is effectively capturing a larger portion of the incident radiation and at the same time is keeping the active layers cooler. A careful thermal balance between the photovoltaic layer, the mounting structure and the heat transfer fluid should be maintained. The local control module which would typically be mounted behind the photovoltaic panel will also benefit from a more stable operating temperature both in hot and in cold weather and as a result can experience an increased service life. Many construction variations can be envisioned to combine the various elements mentioned above each with its own advantages and disadvantages. The present invention in no way is limited to a particular set or combination of such elements.

Various embodiments of the invention are provided in the following detailed description. As will be realized, the invention is capable of other and different embodiments, and its several details may be capable of modifications in various respects, all without departing from the invention. Accordingly, the drawings and description are to be regarded as illustrative in nature and not in a restrictive or limiting sense, with the scope of the application being indicated in the claims.

DETAILED DESCRIPTION

Figure 1:
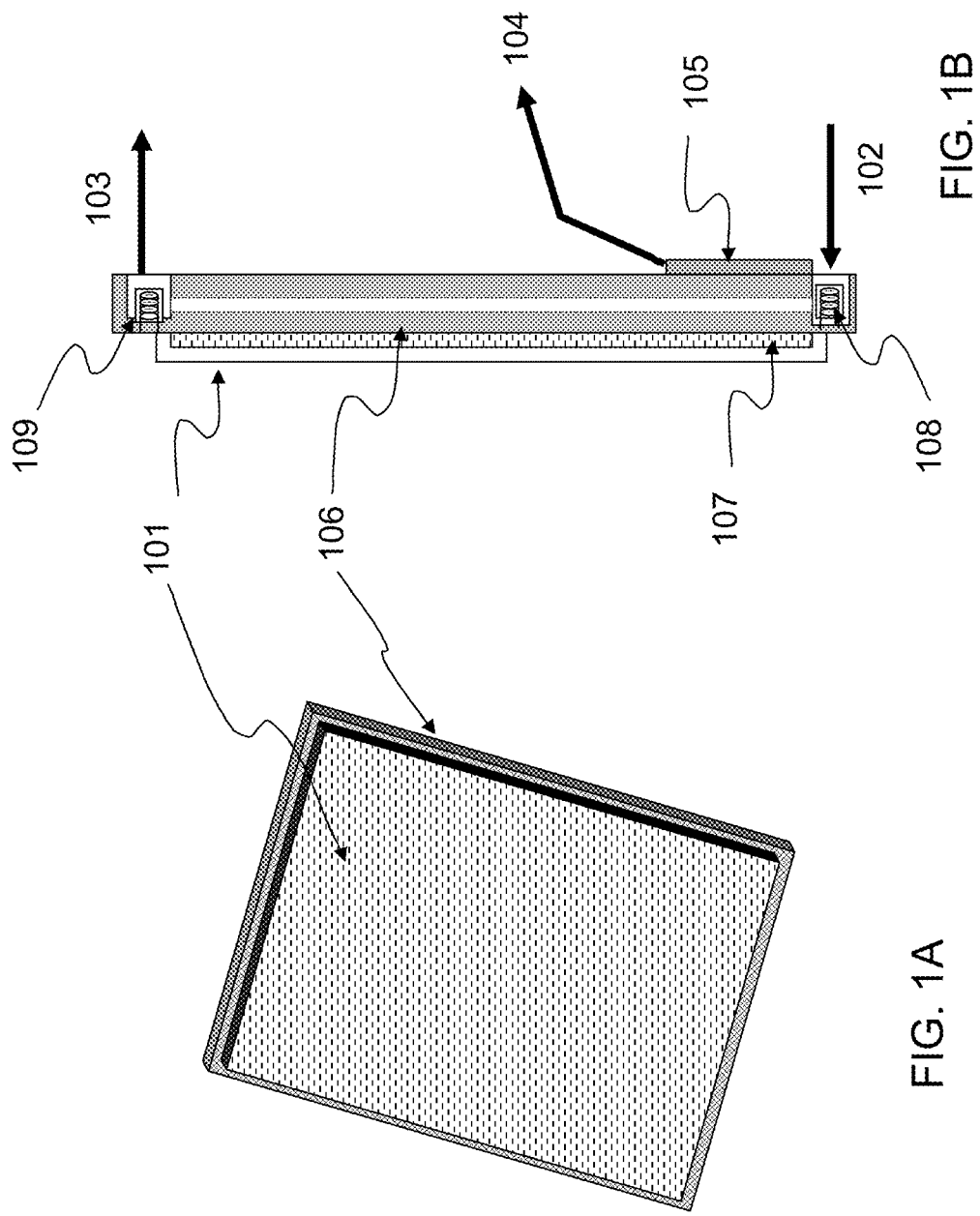
FIGS. 1A and 1B (collectively referred to as FIG. 1) are simplified perspective and cross-sectional views, respectively, of a solar panel employing a photovoltaic active layer, a panel-heated liquid system, and optional panel heating elements in accordance with one or more embodiments of the invention.

FIG. 1 depicts a combination photovoltaic/hot liquid panel in accordance with one or more embodiments of the invention. In the figure, the front of the panel 101 is typically a rectangular shaped glass specifically designed for solar applications. Numerous commercial suppliers of such glass material are available. Referring again to the figure, the glass is covering a layer of active photovoltaic material 107 such as commonly used crystalline-silicon (c-Si) or polysilicon (p-Si) wafers or a stack of thin-film materials. In some embodiments, the c-Si wafers are typically hermitically sealed against the front glass through a layer of Ethylene Vinyl Acetate (EVA), or other properly suitable polymer sheeting. Thin film layers are typically coated onto the glass itself. The resulting glass/photovoltaic layers are in turn bonded to a backing layer (sometimes referred to as a backskin), which for pure solar electrical panels is typically Mylar or Tedlar. In the exemplary embodiment, the active layer stack is thermally bonded to a backing element 106, which provides for a thermal connection to a heat transfer fluid that is introduced at an inlet 102 and moves through the backing element 106 to an outlet 103. As the heat transfer fluid, which is commonly either water or a water glycol mixture, enters the backing material it can be brought into contact with a heating element 108. As the liquid is leaving the backing element 106 and enters the exit cavity 103, another heating element 109 can be provided to transfer heat to the liquid as it is exiting the panel. In some embodiments, the heating element is a Nickel Chromium wire mounted so as to contact the heat transfer liquid. In some embodiments, the heating element is a resistive film heating element coated directly onto the front glass of the photovoltaic module. In some embodiments the heating elements are sized to accept the maximum power of the photovoltaic module. In some embodiments, the power generated by the photovoltaic layers is split into power diverted to the heating elements and power diverted to a DC to AC inverter. In some embodiments such a power split is performed by a control electronic module. The heating elements 108 and 109 can receive power directly from the photovoltaic elements 107 or through an intermediate control module 105 mounted to the rear of the backing element 106. The local control module 105 can provide power to the heating elements as well as to exterior connections 104. In a preferred embodiment, the local control module is able to vary to which heating element or external connection to provide power based on input received from a central controller (not shown in the figure). In a preferred embodiment, such a central controller communicates over a wireless link to the local controller 105. Another advantage of a combination solar photovoltaic/hot liquid panel is that the rear of the panel will essentially assume the temperature of the thermal heat transfer fluid. The rear of the panel is thermally connected to the active photovoltaic layers, thereby keeping those layers at a lower temperature. The photovoltaic layers will therefore be significantly lower in temperature than the temperature of the front glass surface that the panel is mounted to will be. The purpose of the EVA layer is to encapsulate the active photovoltaic materials, but the layer can be sized in such a way that it also provides limited thermal conductance to the front glass of the panel. In some embodiments, the EVA layer is sized to generally minimize thermal conductance to the front glass. In some embodiments, the EVA layer is sized to a thickness between 0.05 and 1.0 mm. In some embodiments, the EVA layer is not bonded to the front glass at all, and a gap between the EVA layer and the front glass is maintained. In some embodiments, such a gap is filled with another material such as a gas. In some embodiments, such a gas is Argon or Nitrogen.

In traditional photovoltaic panel installations the panels themselves are mounted to a frame structure, which in turn is mounted on the roof of a building. The mounting frame conveniently allows the panel to be installed with a small air gap between the rear of the panel and the roof that it is mounted to. Such a gap allows for air circulation behind the panel, allowing hot air behind the panel to escape. In effect the air gap lowers the photovoltaic panel's temperature as well as the temperature of the roof behind the panel. The photovoltaic/hot liquid combination panel in accordance with various embodiments, however, can be mounted directly to the roof structure because the heat transfer liquid is removing the heat, and thus an air gap is no longer needed. This allows for a significantly lower installation cost since the mounting frame and air gap can be eliminated.

Figure 2:
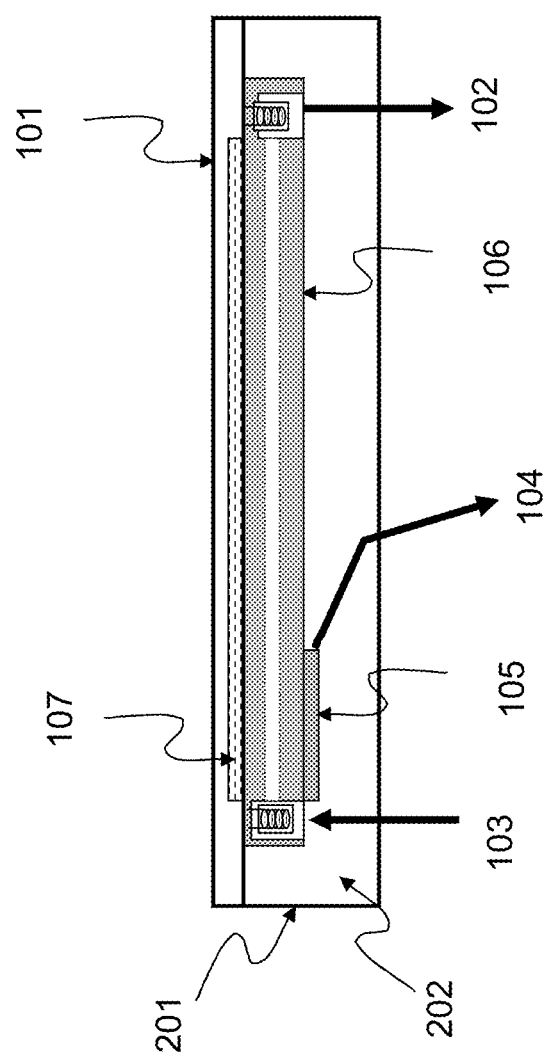
FIG. 2 is a simplified cross-sectional view of an alternate solar panel employing a photovoltaic active layer, a panel-heated liquid system, and optional panel heating elements encapsulated in a sealed enclosure in accordance with one or more embodiments of the invention.

FIG. 2 illustrates an alternative embodiment wherein the complete stack of photovoltaic material 107, front glass 101 and backing element 106 are mounted inside an evacuated envelope 201. In yet another embodiment, the envelope 201 is not evacuated but rather is filled with a thermally isolating material 202.

Figure 3:
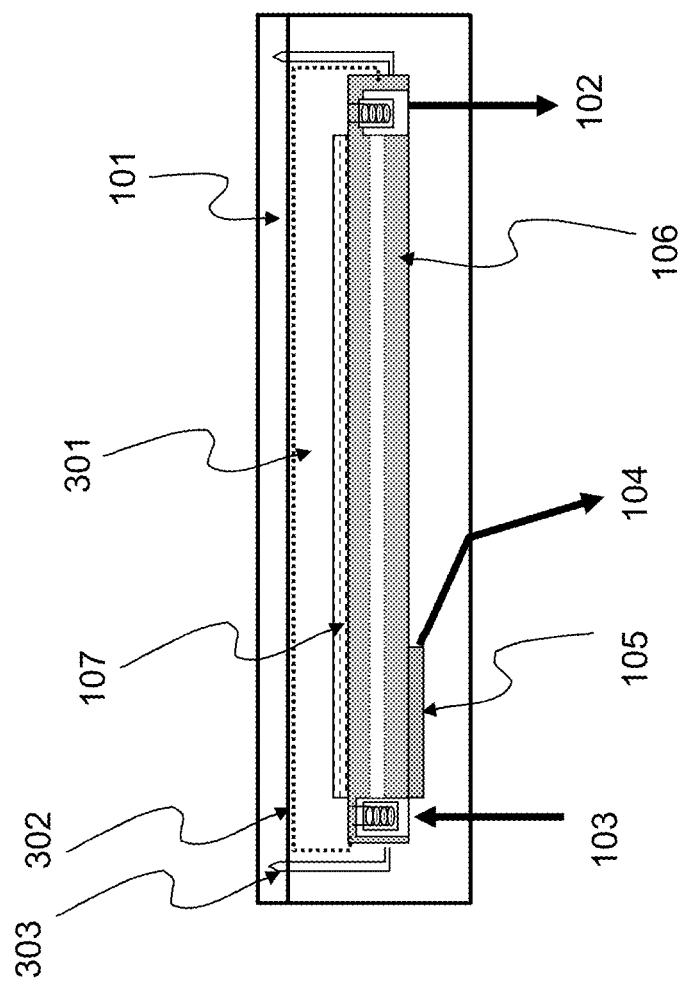
FIG. 3 is a simplified cross-sectional view of a further alternative solar panel employing a photovoltaic active layer, a panel-heated liquid system, and optional panel heating elements encapsulated in a sealed enclosure with thermal isolation in accordance with one or more embodiments of the invention.

FIG. 3 shows generally the same elements of FIG. 1. However, the thermal connection between the photovoltaic layer 107 and the front glass 101 has now been separated by the space 301. In some embodiments, the space 301 is filled with another material such as a gas. In some embodiments, such a gas is Argon or Nitrogen gas. In this embodiment, the photovoltaic layer is much more thermally isolated from the front of the module, so that the layer's temperature is more closely determined by the temperature of the heat transfer fluid. In the implementation of this embodiment, additional heating elements 302 and optional thermocouples 303 can be installed on the front glass 101 to provide heating of the glass for removal of snow, ice, frost and the like. In a preferred embodiment, the photovoltaic layers are kept as cool as possible while at the same time the heat transfer fluid receives as much of the energy as possible that is not absorbed in the form of electrical energy in the photovoltaic layers. A careful balance between these competing demands may be attained so that a generally optimal energy production can be achieved.

Figure 4:
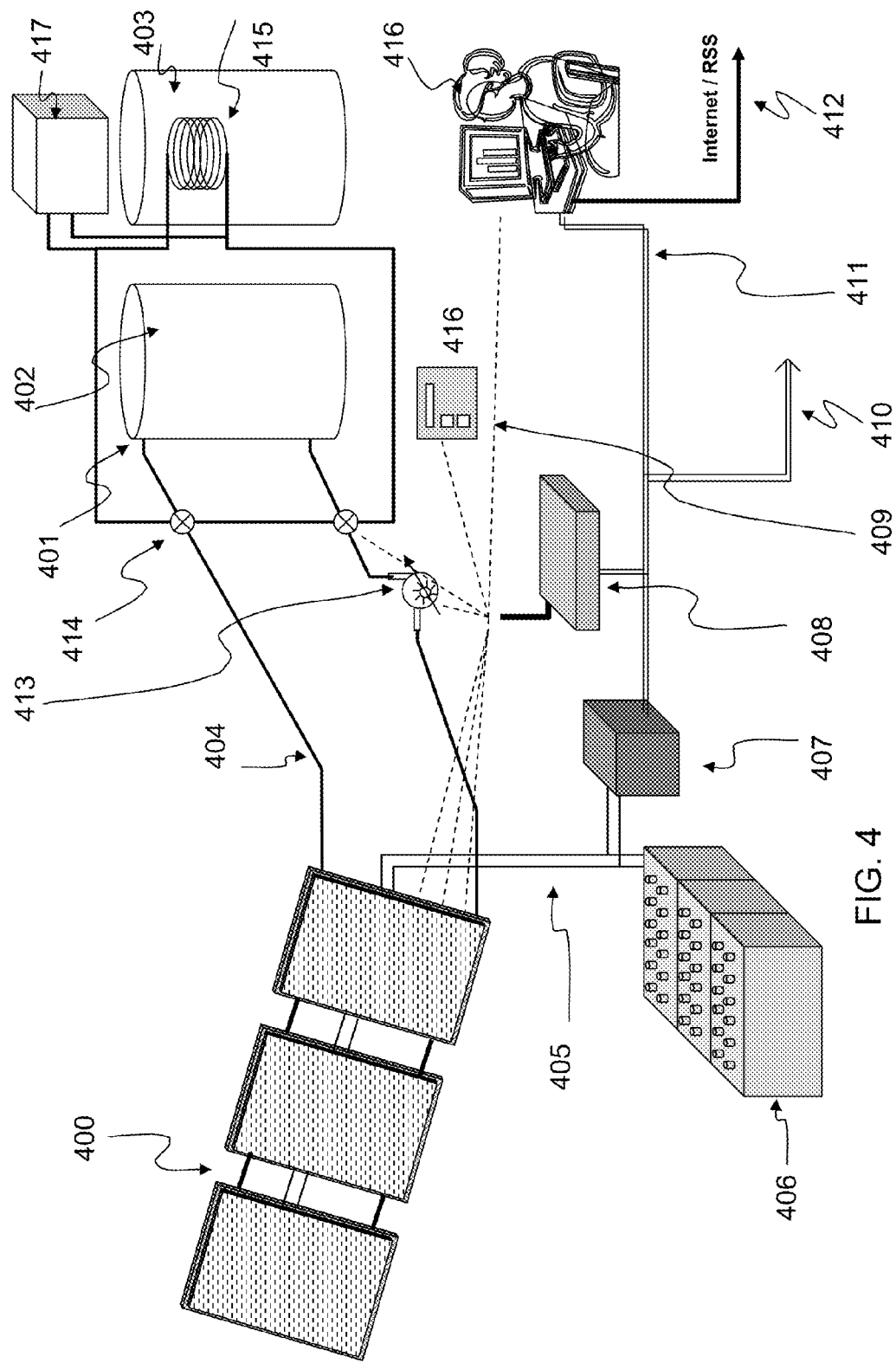
FIG. 4 is a simplified illustration of an overall system design with solar panels that produce both electrical power and heated liquid integrated with a wireless network controlled by a central control unit in accordance with one or more embodiments of the invention.

FIG. 4 shows the integration of photovoltaic/hot liquid panels 400 into an overall system in accordance with one or more embodiments of the invention. The panels 400 can be of the type illustrated in FIGS. 1, 2, and 3 described above. Hot liquid is collected through the means of pipes 404 into a tank or buffer system 402. A valve system 414 is able to direct liquid from the tank to a heat exchanger 415 located in a secondary tank 403. It is understood that many variations of a storage system can be achieved with additional heat exchangers, tanks and valves as well as supplemental heat sources such as boilers and electrical heating elements. It is also understood that excess heat can be transferred to external devices such as heat pumps 417, or can be diverted to convenient other sources requiring hot liquid such as swimming pools, Jacuzzis, or dish or clothes washing equipment. Pumps 413 and valves 414 can be employed to circulate the liquid at desired time and at the desired rates through the system. Such active pump and valve elements can be controlled by a central control unit 408 either through wired connections or alternatively, if more convenient, through wireless connections 409. Electrical energy (usually in the form of a high DC voltage typically between 40 and 600 VDC can be used to charge an optional battery bank 406 or other convenient means of electrical energy storage such as flywheels or capacitors. An inverter 407 is able to control both the battery charging process as well as being able to provide power over AC lines 411 to critical loads in case of failure of the electrical grid 410. Such critical loads are commonly refrigerators, some lights, medical equipment, and circulating pumps for a building's heating system as well as the control modules on furnaces, computers or other critical items that ought to be kept powered at all times. Modern inverters 407 are able to sense the proper function of the building's electrical grid input 410. Furthermore, many buildings provide its computer system 416 with connections to the internet 412. In a preferred embodiment, the central controller 408 is able to connect to the internet 412 through the buildings existing computer network or can be connected directly to the internet or another convenient network and is able to receive information over the internet to allow it to control the building's energy systems for cost minimization. In such an embodiment, the central controller would for example receive electricity prices, gas and oil prices, as well as weather forecasts from an informational source over, for example, a RSS (Really Simple Syndication) feed a technology in common use on the internet today. Furthermore, in such a preferred embodiment, the central controller tracks patterns of energy use in the building on daily, weekly, monthly, or seasonal schedules. The central controller can control both energy production sources such as the photovoltaic/hot liquid panels and the electrical grid coming into the building as well as energy consumption sources such as critical and non-critical loads. Algorithms in the controller can be designed to generally minimize the building owner's cost of energy. By way of example, the controller knows that in a particular household, 40 gallons of hot water are used for showers every morning and the there is very little electricity used during the day. Thus, the controller can decide to produce hot water the previous day at the highest temperature and to store it for use the next morning, while during the rest of the day it is selling electricity back to the grid at a much higher price, while then proceeding to purchase energy from the grid when electricity prices are low. Furthermore, the controller can be set up to have different operating modes. By way of example, operating modes could be designed to generate the lowest cost during normal operation. A vacation mode could be designed, whereby the building's temperature is allowed to fluctuate in a much larger range than normal and where more of the energy produced is sold back to the grid. A survival mode could be designed during which the grid is unavailable and the energy production is maximized to provide as much power as possible to sustain humans in the building in as comfortable a condition as possible. A "melting mode" could exist wherein a cycle is initiated to remove snow, ice and or frost from the surface of the panels. The combinations and other applicable modes could be designed to optimize particular operating scenarios. In another embodiment, the internet connection 412 to the controller 408 can be used for remote troubleshooting of the system as well as for installing software updates and running diagnostic routines and collecting data. In areas where a service engineer is oftentimes not in close proximity of the installation, such remote access and troubleshooting can result in significant savings for both the system installer as well as the building's owners.

In yet another embodiment, the controller 408 communicates over a wireless network to the electrical and gas utility meters that are oftentimes already installed in or near the building. Such a connection then provides additional information to the control algorithm and can potentially also provide a mechanism for the utility company to remotely read its meters over the internet rather than using a vehicle to come within range of the wireless signal coming out of the utility meters.

Figure 5:
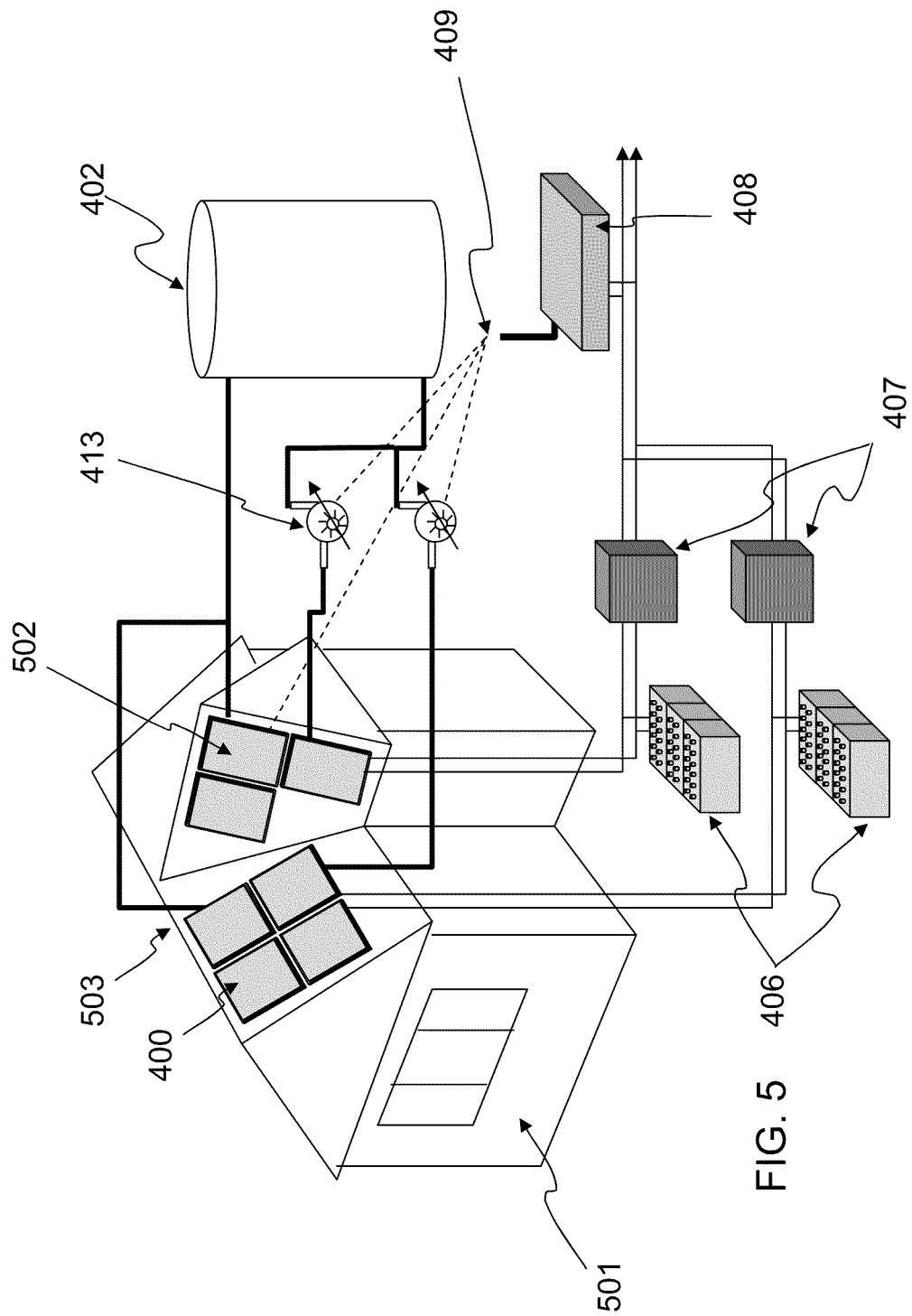
FIG. 5 is a simplified illustration of a multi-zone system implemented in one or more separate areas providing electrical power and heated liquid that is controlled by a single control system in accordance with one or more embodiments of the invention.

FIG. 5 depicts solar photovoltaic/hot liquid panels 400 and 502 that are installed in on the roof 503 of a building 501 in accordance with one or more embodiments. The panels 400 and 502 can be of the type illustrated in FIGS. 1, 2, and 3 described above. Because of the construction of the structure building in this example, two roof sections can be used for the installation of the panels. These two roof sections create different patterns for solar irradiation during the day: when one section is directly exposed, the other section may get more indirect exposure, thereby having different operating settings. The photovoltaic/hot liquid combination panel can easily adjust to different operating conditions on different roof sections. Oftentimes different roof sections need to be combined into separate inverters because of the different behavior of various sections. The photovoltaic/hot liquid panels can easily be integrated in a multi-zone control system and actually can be controlled down to the individual panel is desired.

Figure 6:
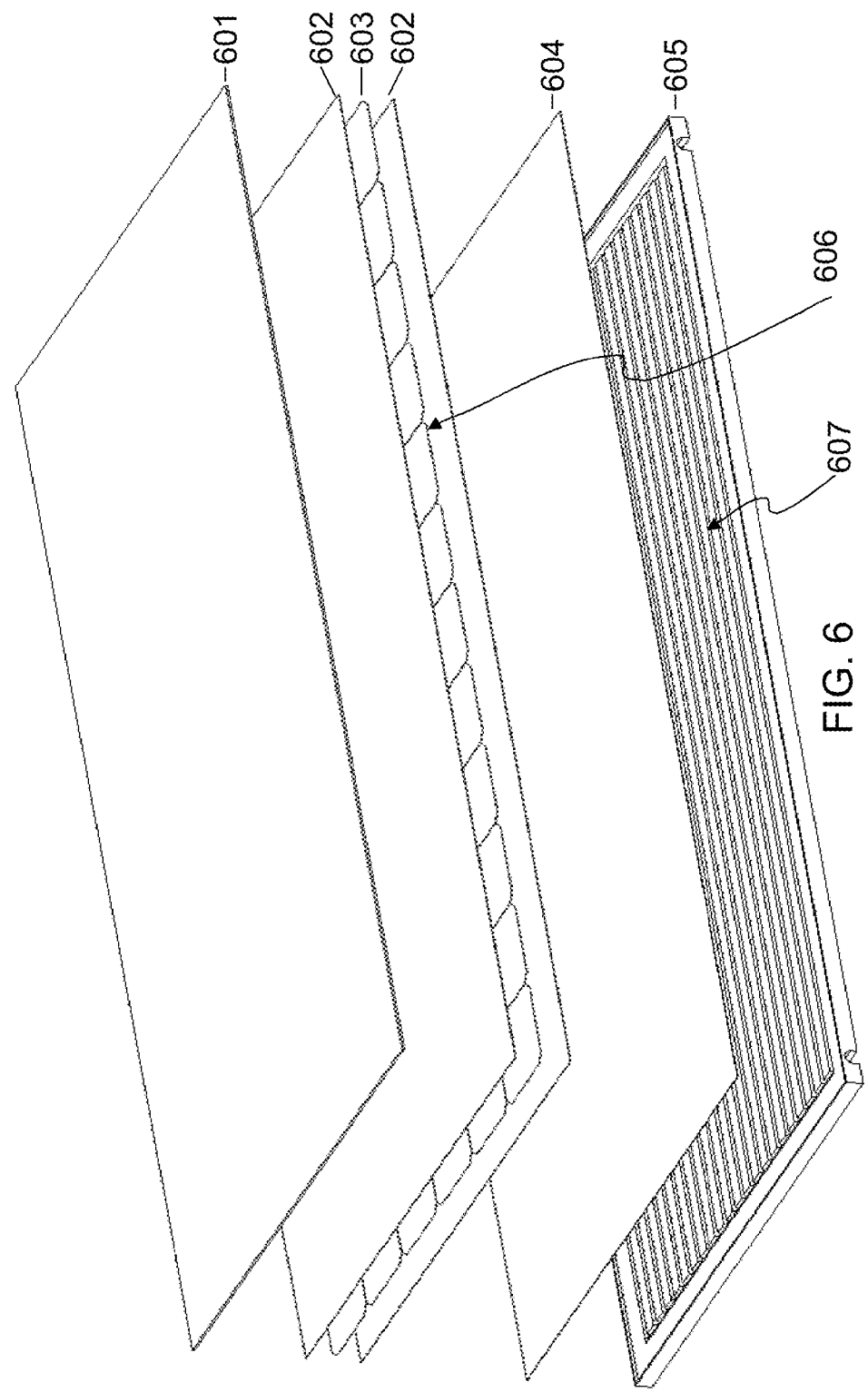
FIG. 6 is a simplified exploded view of the assembly elements of a c-Si or wafer based solar panel using a liquid backing for heating and cooling in accordance with one or more embodiments of the invention.

FIG. 6 provides a detailed drawing of the typical layers used in a c-Si based photovoltaic/hot liquid panel in accordance with one or more embodiments. The cover glass 601 is typically a low-iron, tempered glass designed to withstand impact by foreign objects such as hail and other things that might fall on the panel's surface. Behind the glass 601 are two individual layers 602 of Ethylene Vinyl Acetate (EVA), or other properly suitable polymer sheeting on each side of an active layer of cells 603. The individual cells 606 are commonly c-Si or p-Si cells such as are commonly available from a variety of commercial sources. The backing layer 604 is a thermally conductive layer, such as anodized aluminum or other suitable layer. All layers 601 through 604 are commonly laminated together into a single module that is subsequently bonded into a backing element 605. The backing element 605 provides liquid passage channels 607 in a pattern such that the liquid is brought into generally uniform contact with the thermally conductive layer 604. The advantage of this construction approach is that the backing element 605 can easily be constructed from a suitable material such as recycled plastics injection molded or blow molded into the proper shape, thereby avoiding the need to manually assemble an aluminum frame around the photovoltaic layers thus lowering the assembly cost.

Figure 7:
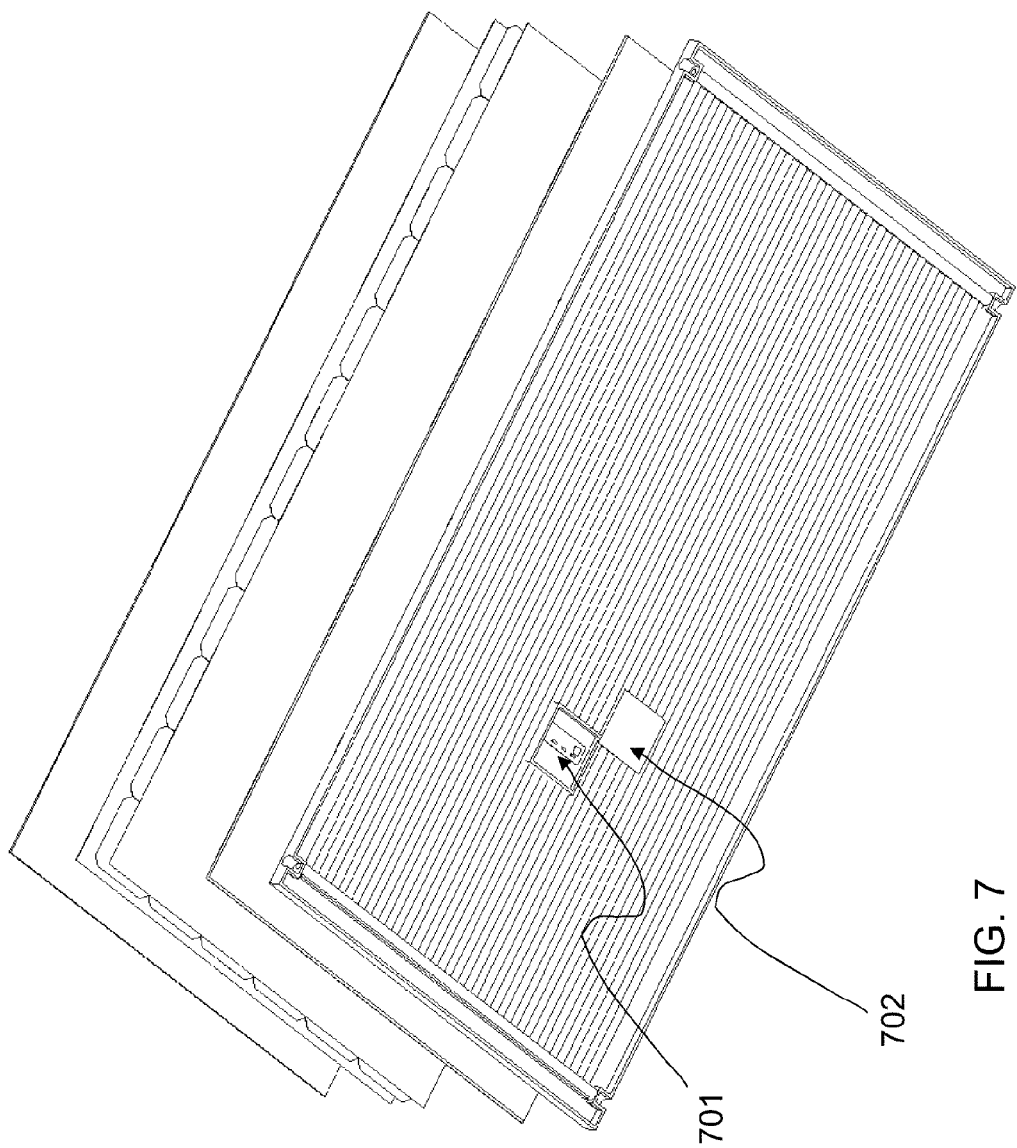
FIG. 7 is a simplified exploded view of the back of the FIG. 6 solar panel, showing details of the panel-integrated wireless control module and the interconnections to other panels in accordance with one or more embodiments of the invention.

FIG. 7 shows the rear of the panel assembly of FIG. 6 in such a way that the local electrical control module 701 is visible with its cover 702 moved off to one side for purposes of illustration. The location of the control module at the rear of the panel near the heat transfer liquid provides for a reasonably stable operating temperature as well as good protection against damage or exposure to water, or solar radiation.

Figure 8:
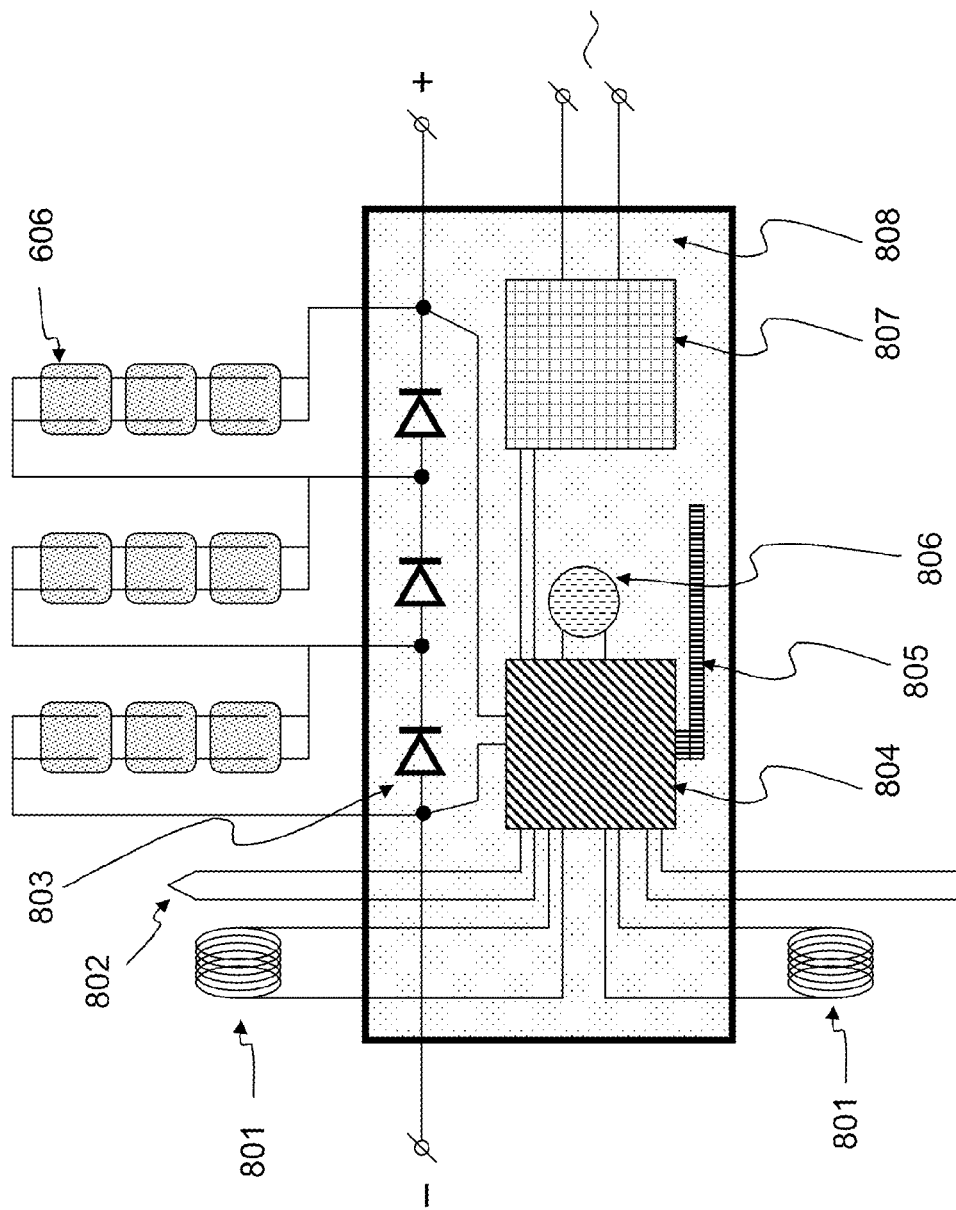
FIG. 8 is a block diagram illustrating a panel-integrated wireless control module in accordance with one or more embodiments of the invention.

FIG. 8 is a simplified block diagram of electrical components in a photovoltaic/hot liquid combination panel in accordance with one or more embodiments. The silicon cells 606 are connected together in strings that are connected to a series of commonly used blocking diodes 803. The blocking diodes provide protection for partially shaded strings of cells. The heating elements 801 and thermocouples 802 are also connected to the printed circuit board 808. A common control chip such as a microprocessor or microcontroller 804 is located on the board 808 and communicates over a wireless connection using the antenna 805. A standby power source 806 such as a battery or capacitor provides temporary power in case no incident light hits the panel or in case the light level is too low. An optional DC to AC converter 807 can be integrated to provide AC power off the panel rather than the more common DC power.

Figures 9A, 9B:
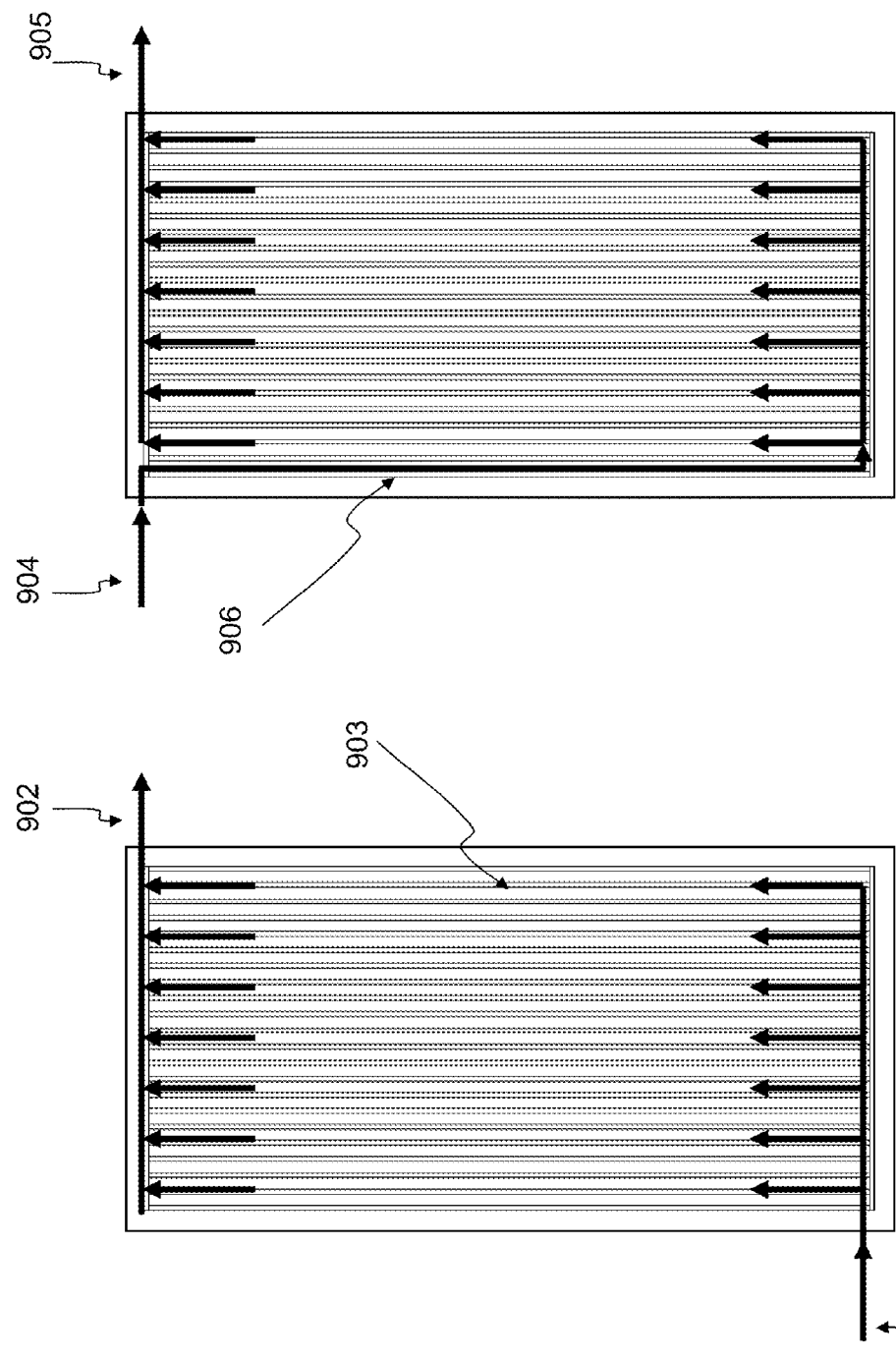
FIGS. 9A and 9B illustrate exemplary liquid flow patterns in the FIG. 6 solar panel, allowing panels to easily be connected in series or in parallel in accordance with one or more embodiments of the invention.

FIGS. 9A and 9B show various channel arrangements in the backing element depicted earlier in FIG. 6 in accordance with one or more embodiments. The liquid inlet 901 spreads the liquid generally evenly through the channels 903. At the top of the panel the channels 903 are recombined into an outlet channel 902. In another embodiment (FIG. 9B), the inlet channel 904 is located near the top of the panel and a separate channel 906 runs down to the bottom of the panel where again the liquid is evenly distributed across the back of the panel. At the top of the panel the channels are recombined into an outlet channel 905. Many other configurations of channels can be devised, each having a tradeoff between ease of mounting panels together in series or in parallel on a roof and the construction complexity of the panel itself.

Figure 10:
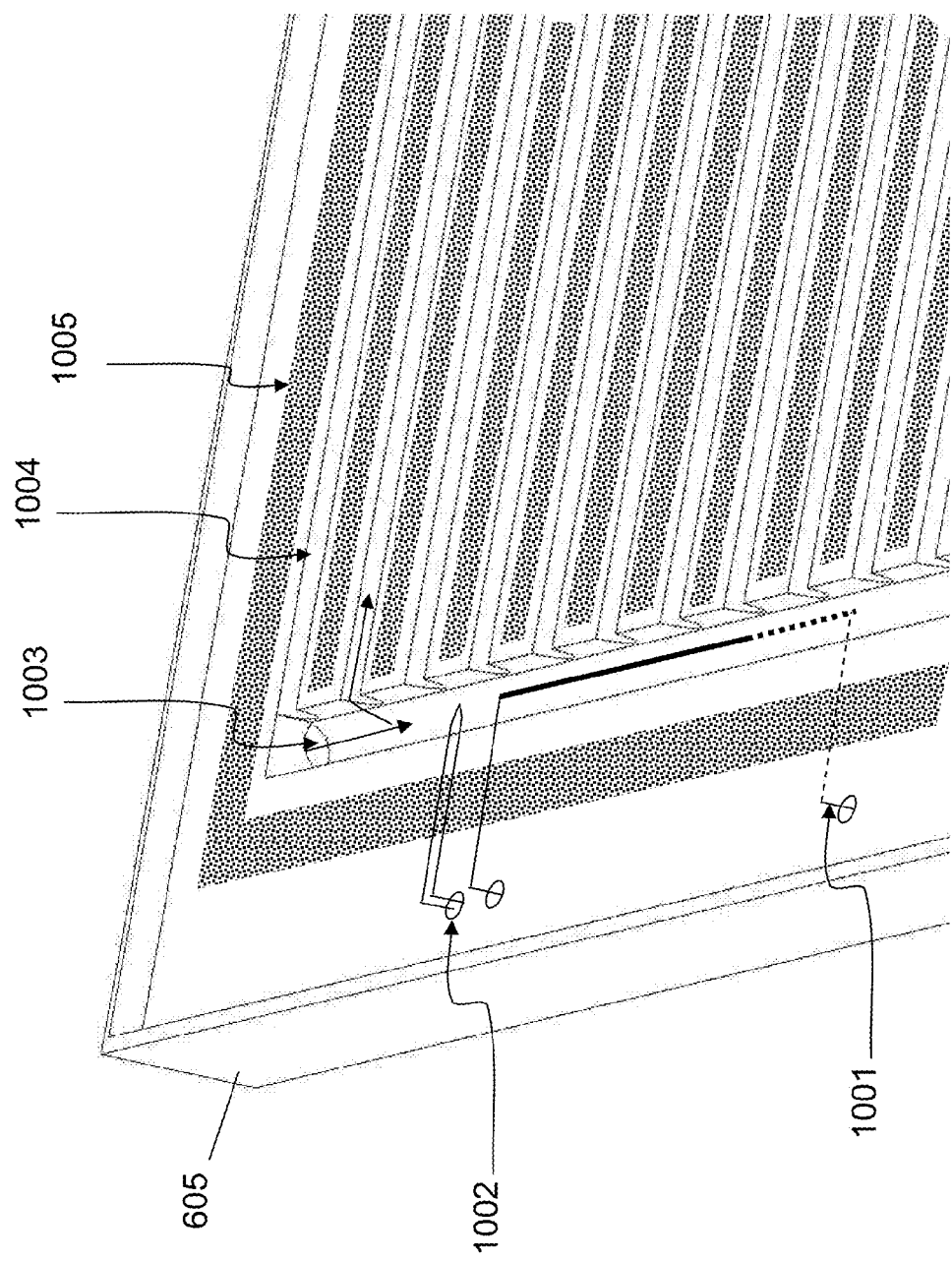
FIG. 10 is a simplified drawing illustrating details of liquid channels, heaters, thermocouples, and channels in a frame module of a solar panel in accordance with one or more embodiments of the invention.

FIG. 10 shows a close up of the backing element 605 and the bonding layers 1005 as well as the heating elements 1001 and the thermocouples 1002 in accordance with one or more embodiments. Heat transfer liquid enters the backing element at the location indicated by arrow 1003 and runs through the individual channels 1004, but will also run along the heating element 1001 and thermocouple 1002. The heating element will allow the liquid to be heated before it starts entering the panel. On the opposite site of the panel a similar heating element and thermocouple can heat the liquid as it is exiting the panel. The thermocouple is able to indicate the temperature increase of the heat transfer fluid and is therefore able to give an indication of how much power has been transferred into the fluid.

Figure 11:
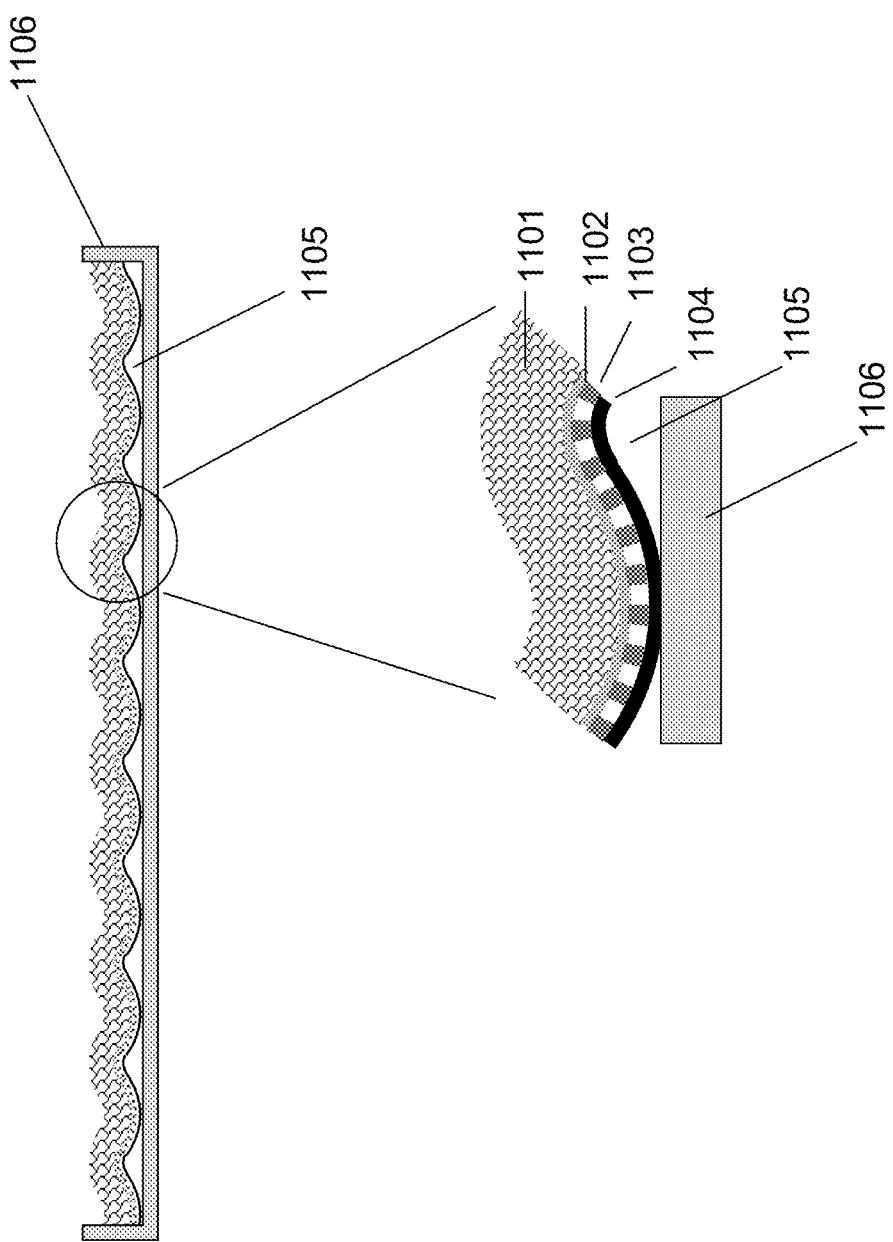
FIG. 11 is a simplified cross-sectional view of an alternate embodiment of a thin-film photovoltaic module that employs a wave shaped structure and is integrated into a liquid backed panel in accordance with one or more embodiments of the invention.

FIG. 11 shows an alternative panel in which the glass 1101 instead of being flat as in the previous examples is now corrugated or wavy in accordance with one or more embodiments. The wave pattern brings higher strength to the glass but also gives the photovoltaic active layer on the back of the glass a greater exposure to the solar radiation during times of the day when the sun is not directly overhead. Furthermore, the wave pattern sets up a light magnification and reflection against the back of the layers that is helpful in providing more opportunities for photons to interact with the photovoltaic layers. In a typical thin film photovoltaic stack the Transparent Conductive Oxide (TCO) layer 1102 is first deposited on the glass 1101. The photo active layers 1103 can be a stack of multiple amorphous silicon or Micromorph silicon layers as well as layers of Cadmium Telluride (CdTe) or Copper Indium Gallium Selenide (CIGS) or other film stacks. A capping layer 1104 encapsulates the electrically active layers and isolates them from the environment. The entire stack of layers 1101 through 1104 can now be bonded to a backing element 1106. However, because of the wavy nature of the front glass 1101, the liquid channels 1105 are automatically created and the backing element 1106 becomes simpler to manufacture. In some embodiments, it would be possible to construct the front glass 1101 with just the front side being wavy in nature and the rear side being flat. In such an embodiment, the flat rear side of the glass 1101 would allow for the integration of c-Si or p-Si cells as discussed earlier.

Figure 12:
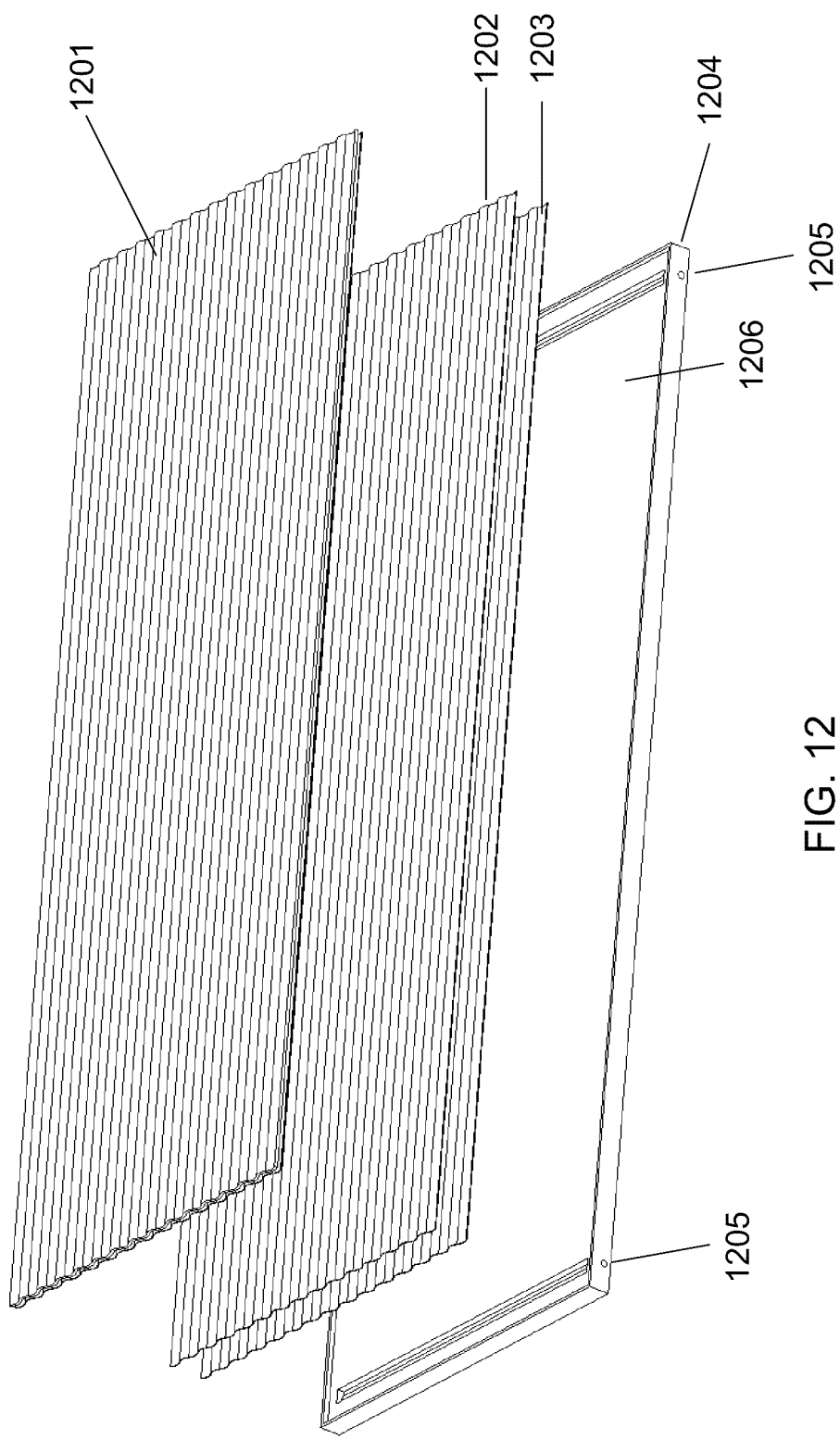
FIG. 12 is a simplified exploded view of a wave shaped photovoltaic panel assembly showing the integration of these components into a liquid backed panel in accordance with one or more embodiments of the invention.

FIG. 12 shows a more detailed assembly of the elements shown in FIG. 11 in accordance with one or more embodiments. The wavy glass with the photovoltaic layers 1201 is thermally bonded to a capping layer 1202 and subsequently bonded to a thermal layer 1203. The backing panel 1206 only needs to provide for entry and exit points for the liquid 1205. The traverse channels can be provided by the wavy glass structure itself and hence the backing panel 1206 does not need to provide longitudinal channels for the heat transfer fluid.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present invention to accomplish the same or different objectives. In particular, acts, elements, and features discussed in connection with one embodiment are not intended to be excluded from similar or other roles in other embodiments. Accordingly, the foregoing description and attached drawings are by way of example only, and are not intended to be limiting.

Having described preferred embodiments of the present invention, it should be apparent that modifications can be made without departing from the spirit and scope of the invention.

Method claims set forth below having steps that are numbered or designated by letters should not be considered to be necessarily limited to the particular order in which the steps are recited.

What is claimed is:

1. A solar energy module, comprising:
   a photovoltaic unit including a layer of one or more solar cells for generating electricity, the layer of one or more solar cells having a front side exposed to incident radiation and an opposite back side;
   a thermal unit thermally coupled to the back side of the layer of one or more solar cells, said thermal unit including one or more channels through which a thermal transfer fluid flows, wherein a portion of the incident radiation is converted into electricity by the layer of one or more solar cells and a portion of the incident radiation is simultaneously converted to heat for increasing the temperature of the thermal transfer fluid in the thermal unit;

a thermal transfer fluid heating system to further increase the temperature of the thermal transfer fluid in the thermal unit; and a controller for controllably splitting the electricity generated by the layer of the one or more solar cells between an electric output of the solar energy module and an electric input to the thermal transfer fluid heating system for use in increasing the temperature of the thermal transfer fluid to thereby control the relative amounts of heat applied to the thermal transfer fluid and electric output of the solar energy module, wherein at least the photovoltaic unit, the thermal unit, and the thermal transfer fluid heating system are assembled in an integrated panel.

2. The solar energy module of claim 1 wherein the thermal transfer fluid heating system is coupled to the thermal unit.

3. The solar energy module of claim 2 wherein the thermal transfer fluid heating system comprises a heating element at a thermal transfer fluid inlet or a thermal transfer fluid outlet of the thermal unit.

4. The solar energy module of claim 1 wherein the photovoltaic unit includes a front glass cover having a resistive film heating element integrated therein for heating the front glass cover to remove snow, ice, condensation, rime, or frost on the photovoltaic unit, or wherein the thermal transfer fluid supplies heat to the solar energy module for removing snow, ice, condensation, rime, or frost on the photovoltaic unit to improve absorption of incident radiation by the layer of one or more solar cells.

5. The solar energy module of claim 1 wherein the layer of one or more solar cells is packaged to inhibit heat transfer from the layer of one or more solar cells to a front cover of the photovoltaic unit and enhance heat transfer to the thermal transfer fluid.

6. The solar energy module of claim 5 wherein the front cover of the photovoltaic unit comprises a front glass cover and wherein a gap is present between the layer of one or more solar cells and the front glass cover, said gap being evacuated or filled with a thermally isolating material to reduce heat transfer to the front glass cover.

7. The solar energy module of claim 1 wherein the thermal unit is incorporated into a backing structure for the layer of one or more solar cells.

8. The solar energy module of claim 1 wherein the controller comprises a local control module in the solar energy module.

9. The solar energy module of claim 1 wherein the electricity generated by the one or more solar cells is controllably split between the electric output of the solar energy module and an electric input of the thermal transfer fluid heating system based on current or forecasted energy prices, weather conditions, energy usage at a facility at which the solar energy module is installed, or time of day.

10. The solar energy module of claim 1 further comprising an outer glass cover having a corrugated structure to more effectively capture solar incident radiation.

11. The solar energy module of claim 10 wherein the layer of one or more solar cells comprises a thin film photovoltaic layer combined with the outer glass cover.

* * * * *